(12) United States Patent
Takamatsu et al.

(10) Patent No.: US 7,195,795 B2
(45) Date of Patent: Mar. 27, 2007

(54) MATERIAL FOR FORMING INSULATION FILM AND FILM-FORMING METHOD WITH THE USE OF THE MATERIAL

(75) Inventors: Yukichi Takamatsu, Kanagawa (JP); Takeo Yoneyama, Kanagawa (JP); Kazuaki Tonari, Kanagawa (JP); Nobumasa Soejima, Kanagawa (JP); Koji Kiriyama, Kanagawa (JP); Takafumi Ishii, Kanagawa (JP)

(73) Assignee: Japan Pionics Co., Ltd., Tokyo (JP)

( * ) Notice: Subject to any disclaimer, the term of this patent is extended or adjusted under 35 U.S.C. 154(b) by 0 days.

(21) Appl. No.: 10/969,185

(22) Filed: Oct. 21, 2004

(65) Prior Publication Data

US 2005/0095361 A1 May 5, 2005

(30) Foreign Application Priority Data

Oct. 30, 2003 (JP) .............................. 2003-370074
Mar. 31, 2004 (JP) .............................. 2004-102151

(51) Int. Cl.
*C23C 16/40* (2006.01)

(52) U.S. Cl. ............................... 427/126.3; 427/126.2; 106/287.16

(58) Field of Classification Search ............ 106/287.16, 106/287.24, 287.26; 427/126.2, 126.3
See application file for complete search history.

(56) References Cited

U.S. PATENT DOCUMENTS

| | | | | | |
|---|---|---|---|---|---|
| 5,569,320 | A | * | 10/1996 | Sasaki et al. | 106/287.26 |
| 5,630,872 | A | * | 5/1997 | Ogi et al. | 106/287.18 |
| 6,085,015 | A | * | 7/2000 | Armand et al. | 385/140 |
| 6,100,415 | A | * | 8/2000 | Takamatsu et al. | 556/42 |
| 6,126,743 | A | * | 10/2000 | Saegusa et al. | 117/68 |
| 6,329,101 | B1 | * | 12/2001 | Kawakami | 429/218.2 |
| 6,617,264 | B1 | * | 9/2003 | Hsiao et al. | 438/780 |
| 2002/0182322 | A1 | * | 12/2002 | McCaughan et al. | 427/255.34 |
| 2002/0195591 | A1 | * | 12/2002 | Ravet et al. | 252/500 |

* cited by examiner

*Primary Examiner*—David M. Brunsman
(74) *Attorney, Agent, or Firm*—Antonelli, Terry, Stout and Kraus, LLP.

(57) ABSTRACT

A material for forming an insulation film comprising an alkoxide compound of lithium and at least one kind of organic solvent selected from ether, ketone, ester, alcohol, and hydrocarbon. A material for forming an insulation film comprising a carboxylate of lithium, an organic solvent, and tetramethoxysilane or tetraethoxysilane. A film-forming method for forming an insulation film with the use of the material for forming an insulation film. An insulation film-forming over the various substrates by spin coating method, mist deposition method or CVD method with the use of these material becomes possible and enables to expect providing an insulation film of high quality and high purity containing lithium or lithium silicate.

7 Claims, 3 Drawing Sheets

MATERIAL FOR FORMING INSULATION FILM AND FILM-FORMING METHOD WITH THE USE OF THE MATERIAL

TECHNICAL FIELD

The present invention relates to a material for forming an insulation film containing lithium, or an insulation film containing lithium silicate over the surface of various substrates by spin coating method, mist deposition method or Chemical Vapor Deposition (CVD) method. The present invention further relates to a film-forming method with the use of the material for forming the insulation film.

BACKGROUND ART

Recently, $SiO_2$, $Si_3N_4$, Phosphor Silicon Glass (PSG), or Boron Phosphor Silicon Glass (BPSG) is used as an electric insulation thin film for a Flat Panel Display (FPD) such as Liquid-Crystal Display (LCD), etc. Further, $Li_2SiO_3$ (lithium silicate) superior in heat resistance to the above insulation films has been developed in late years. (e.g., Japanese Unexamined Patent Application Laid-Open Nos. Hei 8-45723 and 2002-265817) Furthermore, Japanese Unexamined Patent Application Laid-Open Nos. Hei 8-45723 and 2002-265817 respectively disclose a method of applying an aqueous solution of lithium silicate comprising $Li_2O$ and $SiO_2$ over a substrate and drying as a lithium silicate film-forming method over the surface of the substrate. Moreover, WO97/20962 (PCT International Publication corresponding to Japanese PCT Patent Publication No. P2000-509100A) discloses a film-forming method employing sputtering of lithium.

A lithium silicate film-forming method by spin coating method, mist deposition method or Chemical Vapor Deposition (CVD) method is conceivable; however, it was disadvantageous being incapable of uniformly atomizing or vaporizing because the aqueous solution of the material for forming insulation film was in gel-like state. Further, merely replacing the water in the material by an organic solvent was not efficient in mixing homogeneously because solubility was small. Therefore, the lithium silicate film-forming by the above methods were not practical because they provide an insulation film of lower quality than sol-gel method or sputtering method.

Particularly when a liquid material made by dissolving solid materials in a solvent of tetrahydrofuran and so on is vaporized by CVD method after being fed to a vaporizer, the conventional method had problems not only that it hardly provides homogenuous materials but also that it easily precipitate solid materials because only solvent vaporizes with the temperature rise caused by the great difference between the vaporization temperature of the solid materials and the vaporization temperature of the solvent.

As thus described, a lithium silicate insulation film-forming by spin coating method, mist deposition method or CVD method is considered to be difficult, however, insulation film-forming by these method, particularly by CVD method makes it possible to expect providing an insulation film of high quality and high purity.

SUMMARY OF THE INVENTION

Under the foregoing circumstances, an object of the present invention is to provide a material for forming an insulation film of high quality and high purity containing lithium or lithium silicate over the surface of various substrates by spin coating method, mist deposition method or CVD method. Another object of the present invention is to provide a film-forming method with the use of the material for forming the insulation film.

The present invention was completed by zealously examining to achieve the foregoing objects and finding that an alkoxide compound of lithium easily and homogeneously dissolves in ether, ketone, ester, alcohol, or hydrocarbon; that an alkoxide compound of lithium or a carboxylate of lithium, tetramethoxysilane or tetraethoxysilane, and an organic solvent mix easily and homogeneously each other; and that employing these mixtures as materials can prevent separating the solid materials and the solvent caused by vaporizing of only the solvent in an occasion of vaporization.

Namely, the first aspect of the present invention is a material for forming an insulation film comprising (A) lithium alkoxide compound, at least one kind of (B) organic solvent selected from ether, ketone, ester, ethyl alcohol, and hydrocarbon.

The second aspect of the present invention is the material for forming an insulation film further comprising (C) tetramethoxysilane or tetraethoxysilane.

Moreover, the third aspect of the present invention is a material for forming an insulation film comprising (A') carboxylate of lithium, (B) organic solvent, and (C) tetramethoxysilane or tetraethoxysilane.

Furthermore, the present invention provides a film-forming method with the use of the foregoing material for forming an insulation film containing lithium, or an insulation film containing lithium silicate over the surface of substrates by spin coating method, mist deposition method or CVD method.

BRIEF DESCRIPTION OF THE DRAWINGS

FIG. 1 illustrates a schematic structure of an embodiment of the apparatus to carry out a film-forming method of the present invention by spin coating method;

FIG. 2 illustrates a schematic structure of an embodiment of the apparatus to carry out a film-forming method of the present invention by mist deposition method;

FIG. 3 illustrates a schematic structure of an embodiment of the apparatus to carry out a film-forming method of the present invention by CVD method;

FIG. 4 illustrates a schematic structure of another embodiment of the apparatus except FIG. 3 to carry out a film-forming method of the present invention by CVD method;

FIG. 5 illustrates a schematic structure of another embodiment of the apparatus except FIGS. 3 and 4 to carry out a film-forming method of the present invention by CVD method; and FIG. 6 illustrates a schematic structure of an embodiment of a vaporizer to carry out a film-forming method of the present invention by CVD method.

PREFERRED EMBODIMENT TO CARRY OUT THE INVENTION

The present invention is applied to a material for forming an insulation film containing lithium such as lithium silicate or so over the surface of various substrates and to an insulation film-forming method over the surface of various substrates using the material.

As a lithium source in the material for forming the insulation film of the present invention, (A) alkoxide compound of lithium or (A') carboxylate of lithium is employed.

Figure 1:
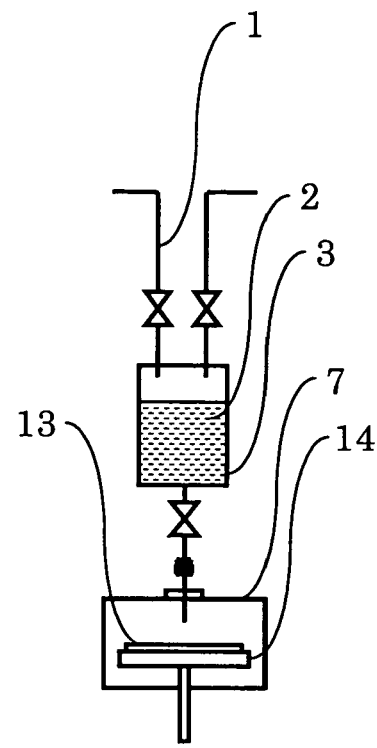

Further, in the case where a silicon source is used, (C) tetramethoxysilane or tetraethoxysilane is employed as the silicon source. Furthermore, (B) organic solvent such as ketone, ester, alcohol, hydrocarbon, etc., is added to the material in order to make it homogeneous solution.

Examples of the (A) alkoxide compound of lithium used in the present invention include methoxylithium, ethoxylithium, n-propoxylithium, iso-propoxylithium, n-butoxylithium, iso-butoxylithium, sec-butoxylithium, tert-butoxylithium, etc. Further, examples of (A') carboxylate of lithium used in the present invention include formic acid lithium, lithium acetate, propionic acid lithium, etc. Furthermore, (B) organic solvent such as ether, ketone, ester, alcohol, hydrocarbon or so usually has a boiling point at the temperature in the range from 40° C. to 180° C. The organic solvent may be used alone or in combination of two or more kinds thereof.

Examples of the ether include propylether, methylbutylether, ethylpropylether, ethylbutylether, trimethylene oxide, tetrahydrofuran, tetrahydropyran, etc. Examples of the ketone include acetone, ethylmethylketone, iso-propylmethylketone, iso-butylmethylketone, etc. Examples of the ester include ethyl formate, propyl formate, isobutyl formate, methyl acetate, ethyl acetate, propyl acetate, butyl acetate, isobutyl acetate, methyl propionate, propionic acid propyl, methyl butyrate, butyric ester, etc. Examples of the alcohol include methyl alcohol, ethyl alcohol, propyl alcohol, butyl alcohol, etc. Examples of hydrocarbon include hexane, heptane, octane, etc.

In the material for forming an insulation film comprising (A) lithium alkoxide compound and (B) organic solvent as the first aspect of the present invention, the content of the (A) lithium alkoxide compound in the total amount of the material is usually 5 to 80% by weight, preferably 20 to 80% by weight. In the material for forming an insulation film comprising (A) lithium alkoxide compound (lithium source), (B) organic solvent and (C) tetramethoxysilane or tetraethoxysilane (silicon source) as the second aspect of the present invention, the content of the lithium source in the total amount of the material is usually 5 to 80% by weight, preferably 20 to 80% by weight and the content of the silicon source in the total amount of the material is usually 5 to 75% by weight, preferably 20 to 75% by weight. Further, the material for forming an insulation film comprising (A') carboxylate of lithium (lithium source), (B) organic solvent and (C) tetramethoxysilane or tetraethoxysilane (silicon source) as the third aspect of the present invention, the content of the lithium source in the total amount of the material is usually 1 to 50% by weight, preferably 2 to 30% by weight and the content of the silicon source in the total amount of the material is also usually 5 to 75% by weight, preferably 20 to 75% by weight.

Regarding the preparation method of the material, it is not particularly specified. For example, with regard to the preparation of the material for forming an insulation film comprising (A') carboxylate of lithium (lithium source), (B) organic solvent and (C) tetramethoxysilane or tetraethoxysilane (silicon source) as the third aspect of the present invention, it may be prepared after combining any two component among (A') lithium source, (B) organic solvent and (C) silicon source, followed by adding and mixing the remaining one component, or, prepared by simultaneously combining the entire components (A'), (B) and (C). However, it is preferable that the components except (C) tetramethoxysilane or tetraethoxysilane are preparedly combined followed by adding and mixing tetramethoxysilane or tetraethoxysilane because either the tetramethoxysilane or the tetraethoxysilane easily decomposes by moisture content.

The material for forming an insulation film thus prepared is homogeneous and stable at room temperature, at the temperature (0 to 40° C.) neighboring the room temperature, under ordinary pressure, under the pressure (80 to 120 kPa) neighboring ordinary pressure, and under the atmosphere of inert gas.

Moreover, a surface active agent may be further added to the material for forming an insulation film in the present invention. In the case where the surface active agent is added to the material for forming an insulation film, the amount of the surface active agent is usually up to 5% by weight, preferably up to 1% by weight of the total amount of the material.

The material for forming an insulation film of the present invention is a material substantially comprising the foregoing components, and either the case where it contains small amount of ingredient except the alkoxide compound of lithium and the carboxylate of lithium as the lithium source, or the case where it contains small amount of ingredient except the tetramethoxysilane and the tetraethoxysilane as silicon source falls within the scope of the present invention unless these ingredients give unfavorable effects against homogeneity after blending. Further, even the case where the material for forming an insulation film contains a small amount of a component without giving unfavorable effects against the homogeneity of the material or to the quality of the insulation film falls within the scope of the present invention. For example, $P_2O_5$ or $PO(OCH_3)_3$ may be added in an appropriate amount as a dopant in the material for forming an insulation film.

The present invention provides a film-forming method with the use of the foregoing material prepared for forming an insulation film containing lithium, or an insulation film containing lithium silicate over the surface of substrates such as silicon substrate, ceramics substrate, glass substrate, metal substrate, alloy substrate or so by spin coating method, mist deposition method or CVD method.

In the case where the insulation film is formed by spin coating method or mist deposition method, the material comprising lithium source, silicon source and organic solvent is usually employed among the materials for forming the insulation film of the present invention. On the other hand, in the case where the insulation film is formed by CVD method, the materials for forming the insulation film in all aspects of the present invention may be employed.

Figure 2:
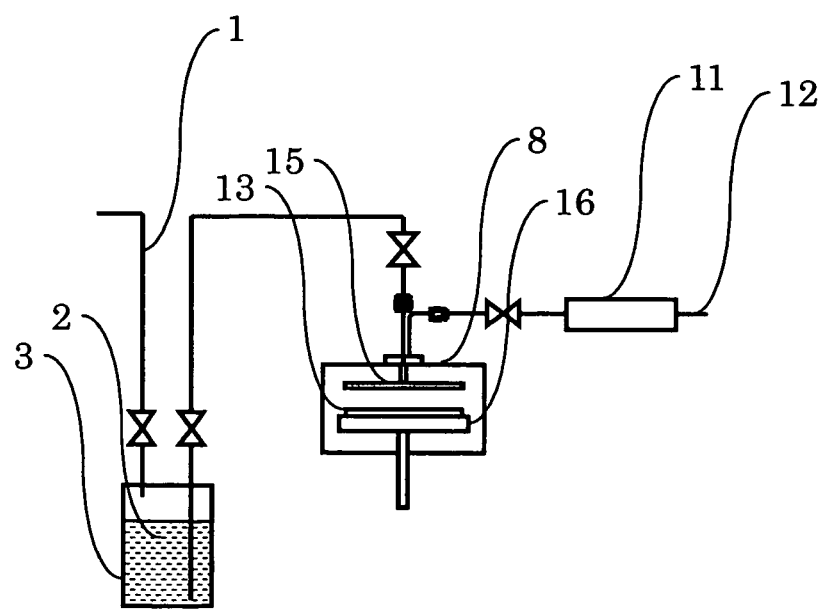
Figure 3:
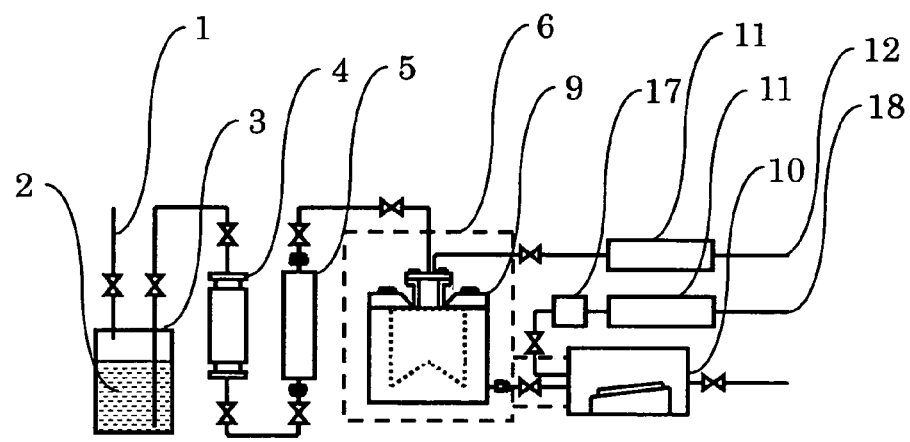
Figure 4:
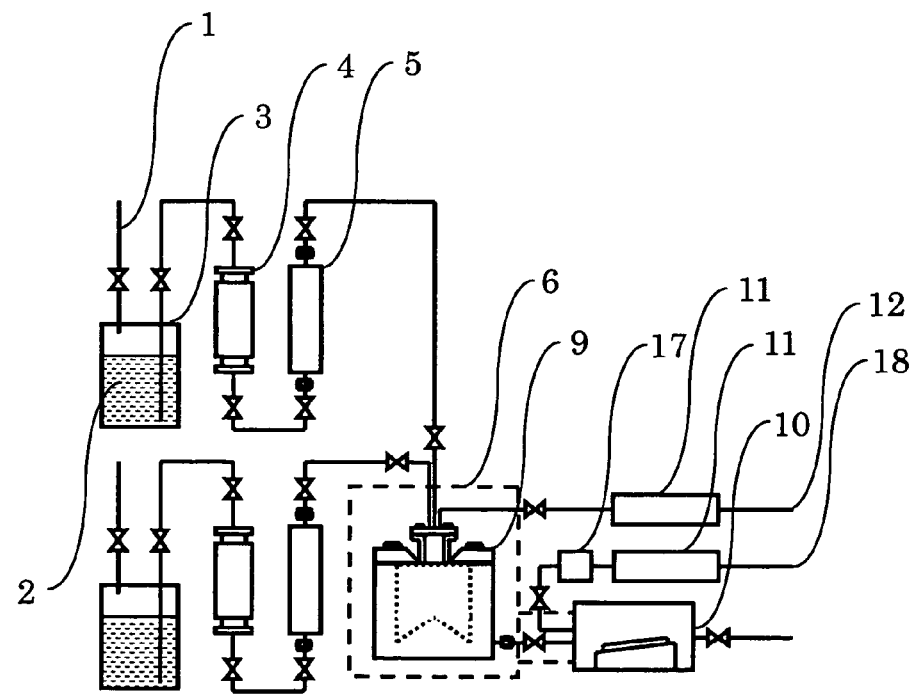
Figure 5:
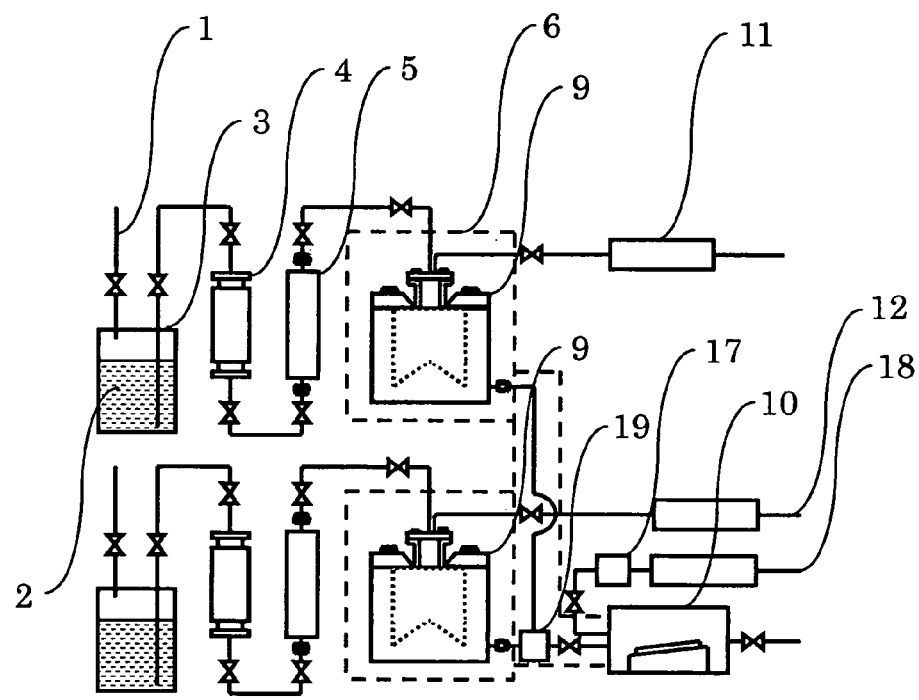

FIG. 1 illustrates a schematic structure of an embodiment of the insulation film-forming apparatus by spin coating method; FIG. 2 illustrates a schematic structure of an embodiment of the insulation film-forming apparatus by mist deposition method; and FIGS. 3 to 5 illustrate schematic structures of an embodiment of the insulation film-forming apparatus by CVD method; however, apparatus for carrying out the present invention is not limited to those.

As shown in FIGS. 1 and 2, a material 2 for forming an insulation film filled in a material container 3 is fed to a spin coating machine 7 or a mist deposition equipment 8 by the pressure of inert gas fed through inert gas supply pipeline 1.

In the case of film-forming by spin coating method, a high-speed rotating disk 14 and a heater are usually installed in the spin coating machine 7 as shown in FIG. 1. In an occasion of the insulation film-forming, after settling the temperature and the pressure inside of the spin coating machine at predetermined values, both the rotating disk 14 and a substrate 13 placed on the rotating disk rotate with high-speed, and at the same time, the material for forming the insulation film is fed from the material container 3 by the pressure of the inert gas and drips on the central portion of the substrate 13. In that occasion, because the extremely homogeneous material for forming the insulation film of the present invention evenly spreads towards peripheral contour over the substrate by the effect of centrifugal force, an insulation film of high quality and high purity is obtained on the substrate after heat-treating the spread material at the temperature of about 150 to 800° C.

In the case of film-forming by mist deposition method, a shower head 15 which supplies the material for forming the insulation film making it misty over the substrate, a susceptor 16 and a heater are usually installed in the mist deposition equipment 8 as shown in FIG. 2. In an occasion of the insulation film-forming, after settling the temperature and the pressure inside of the mist deposition equipment 8 at predetermined values, the material for forming the insulation film is fed from the material container 3 by the pressure of the inert gas to the shower head 15. In that occasion, because the extremely homogeneous material for forming the insulation film of the present invention is atomized uniformly, an insulation film of high quality and high purity is obtained on the substrate after heat-treating the spread material at the temperature of about 150 to 800° C.

In the case of film-forming by CVD method, a liquid flow controller 5 such as a liquid mass flow controller or so, a vaporizer 9, and a CVD equipment 10 are usually installed with optionally attaching a degasser 4 in addition as shown in FIGS. 3 to 5. Further, a gas flow controller 11 and a carrier gas supply pipeline 12 are connected to the vaporizer 9 surrounded by a heat insulator 6. Furthermore, a gas preheater 17 and an oxygen supply pipeline 18 are connected to the CVD equipment 10. In an occasion of the insulation film-forming, after settling the temperature and the pressure inside of the vaporizer and the CVD equipment at predetermined values, the material 2 for forming the insulation film is fed from the material container 3 by the pressure of the inert gas to the vaporizer 9, followed by being vaporized, and is further supplied to the CVD equipment 10. In that occasion, because the extremely homogeneous material for forming the insulation film of the present invention is vaporized uniformly, an insulation film of high quality and high purity is obtained on the substrate.

Further, referring again to FIGS. 4 and 5, the material container filled with a material prepared by dissolving lithium alkoxide compound in at least one organic solvent selected from ether, ketone, ester, ethyl alcohol and hydrocarbon is installed as one material container, and the material container filled with an arbitrary material such as tetramethoxysilanen or tetraethoxysilane is installed as the other material container.

Further in the case of film-forming by CVD method, one or more kind of gas selected from oxygen, ozone and steam or a gas containing them is usually added before the gas containing the vaporized material is supplied to the CVD equipment or immediately after it is supplied to the CVD equipment.

Additionally in FIG. 5, numerical symbol 18 shows a supply pipeline for oxygen, ozone, and steam, and numerical symbol 19 shows a gas mixing unit.

Figure 6:
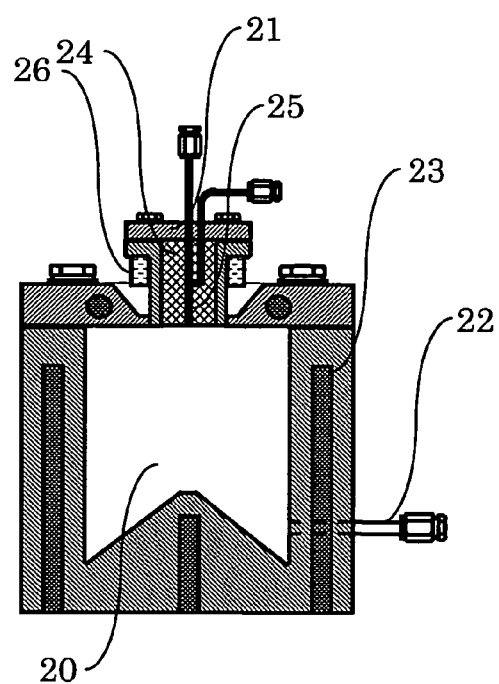

Furthermore, although the vaporizer 9 employed in the present invention is not particularly specified, for example, a vaporizer with the material feed portion 21 whose interior comprises a corrosion resistant synthetic resin 24 such as fluorocarbon polymers, polyimide-based resin or so, a vaporizer with an ejection tube of double structure 25 consisting of an inner tube for a liquid material and an outer tube for a carrier gas as the ejection tube 25 for ejecting and vaporizing the liquid material to a vaporizing chamber 20, or a vaporizer having means 26 for flowing cooling water around the outside surface of the CVD material feed portion are exemplified each as shown in FIG. 6. Still further, not only a vaporizer vaporizing one kind of liquid material, but also a vaporizer simultaneously vaporizing two kinds or more liquid materials is employable in the present invention.

EXAMPLES

The present invention will be described in further detail with reference to Examples, which does not limit the scope of this invention.

Example 1

(Preparation of a Material for Forming an Insulation Film)

Nitrogen gas was fed through the inert gas supply pipeline to a container made of stainless steel (SUS 316) and with the internal diameter of 8 cm and the height of 10 cm, and the interior of the container became ambient atmosphere of nitrogen. Subsequently, 30 g of tert-butoxylithium (t-BuOLi) as the lithium alkoxide compound was cast into the container, and 70 g of octane as the organic solvent was added thereby dissolving the tert-butoxylithium (t-BuOLi), then, stirring the liquid mixture at the temperature of 25° C. and at the condition of ordinary pressure, a material for forming an insulation film was prepared.

(Evaluation About the Homogeneity of the Material for Forming an Insulation Film)

While maintaining the condition at the temperature of 25° C. and at ordinary pressure, the material for forming an insulation film was sampled at 30 minutes, 2 hours, 10 hours, 24 hours, and 100 hours respectively after mixing, and was evaluated whether the material was mixed homogeneously or not. The results are shown in Table 1.

Examples 2 to 5

Examples 2 to 5 were conducted similarly as Example 1 except that the amount of the content of tert-butoxylithium (t-BuOLi) was changed to 10 g, 20 g, 40 g, and 50 g; and the amount of the content of octane was changed to 90 g, 80 g, 60 g, and 50 g respectively. As the results, materials for forming the insulation film were prepared. Evaluation about the homogeneity of the material for forming the insulation film was carried out in the same way as Example 1 and the results are shown Table 1.

Examples 6 to 12

Examples 6 to 12 were conducted similarly as Example 1 except that tert-butoxylithium (t-BuOLi) was replaced by methoxylithium (MeOLi), ethoxylithium (EtOLi), n-propoxylithium (n-PrOLi), iso-propoxy lithium (i-PrOLi), n-butoxylithium (n-BuOLi), iso-butoxylithium (i-BuOLi), or sec-butoxylithium (s-BuOLi) respectively. As the results, materials for forming the insulation film were prepared. Evaluation about the homogeneity of the material for forming the insulation film was carried out in the same way as Example 1 and the results are shown Table 1.

Examples 13 to 15

Examples 13 to 15 were conducted similarly as Example 1 except that octane was replaced by acetone, ethylacetate, or ethyl alcohol respectively. As the results, materials for forming the insulation film were prepared. Evaluation about the homogeneity of the material for forming the insulation film was carried out in the same way as Example 1 and the results are shown Table 1.

Example 16

Example 16 was conducted similarly as Example 1 except that the addition amount of octane was changed to 40 g and that tetraethoxysilane (TEOS) was added in an amount of 30 g. As a result, a material for forming an insulation film was prepared. (tert-butoxylithium (t-BuOLi): 30% by weight, tetraethoxysilane (TEOS): 30% by weight, octane: 40% by weight) Evaluation about the homogeneity of the material for forming the insulation film was carried out in the same way as Example 1 and the results are shown Table 1.

Examples 17 and 18

Examples 17 and 18 were conducted similarly as Example 16 except that the amount of the content of tert-butoxylithium (t-BuOLi) was changed to 10 g and 50 g; and the amount of the content of octane was changed to 60 g and 20 g respectively. As the results, materials for forming the insulation film were prepared. Evaluation about the homogeneity of the materials for forming the insulation film was carried out in the same way as Example 1 and the results are shown Table 1.

Examples 19 and 20

Examples 19 and 20 were conducted similarly as Example 16 except that the amount of the content of tetraethoxysilane (TEOS) was changed to 10 g and 50 g; and the amount of the content of octane was changed to 60 g and 20 g respectively. As the results, materials for forming the insulation film were prepared. Evaluation about the homogeneity of the materials for forming the insulation film was carried out in the same way as Example 1 and the results are shown Table 1.

Examples 21 to 27

Examples 21 to 27 were conducted similarly as Example 16 except that tert-butoxylithium (t-BuOLi) was replaced by methoxylithium (MeOLi), ethoxylithium (EtOLi), n-propoxylithium (n-PrOLi), iso-propoxy lithium (i-PrOLi), n-butoxylithium (n-BuOLi), iso-butoxylithium (i-BuOLi), or sec-butoxylithium (s-BuOLi) respectively. As the results, materials for forming the insulation film were prepared. Evaluation about the homogeneity of the materials for forming the insulation film was carried out in the same way as Example 1 and the results are shown Table 1.

Example 28

Example 28 was conducted similarly as Example 16 except that tetraethoxysilane (TEOS) was replaced by tetramethoxysilane (TMOS) and a material for forming an insulation film was prepared. Evaluation about the homogeneity of the material for forming the insulation film was carried out in the same way as Example 1 and the results are shown Table 1.

Examples 29 to 31

Examples 29 to 31 were conducted similarly as Example 16 except that octane was replaced by acetone, ethylacetate, or ethyl alcohol respectively. As the results, materials for forming the insulation film were prepared. Evaluation about the homogeneity of the material for forming the insulation film was carried out in the same way as Example 1 and the results are shown Table 1.

Additionally, the evaluation of homogeneity in this specification was carried out visually by human's inspection and ranked by the following standards.

A: The material for forming an insulation film was mixed homogeneously.

B: The material for forming an insulation film was not mixed so homogeneously as complete.

C: The lithium compound was not dissolved and the material for forming an insulation film was not mixed homogeneously.

TABLE 1

| | Material and content (wt %) for forming insulation film | | | Homogeneity after a lapse of time (hr) | | | | |
|---|---|---|---|---|---|---|---|---|
| Ex. | Li Source | Si Source | Solvent | 0.5 | 2 | 10 | 24 | 100 |
| 1 | t-BuOLi (30) | — | Octane (70) | B | A | A | A | A |
| 2 | t-BuOLi (10) | — | Octane (90) | A | A | A | A | A |
| 3 | t-BuOLi (20) | — | Octane (80) | B | A | A | A | A |
| 4 | t-BuO (40) | — | Octane (60) | C | B | A | A | A |
| 5 | t-BuOLi (50) | — | Octane (50) | C | C | B | A | A |
| 6 | MeOLi (30) | — | Octane (70) | C | C | B | A | A |
| 7 | EtOLi (30) | — | Octane (70) | C | B | B | A | A |
| 8 | n-PrOLi (30) | — | Octane (70) | B | B | A | A | A |
| 9 | i-PrOLi (30) | — | Octane (70) | C | B | A | A | A |
| 10 | n-BuOLi (30) | — | Octane (70) | C | C | B | A | A |
| 11 | i-BuOLi (30) | — | Octane (70) | C | B | A | A | A |
| 12 | s-BuOLi (30) | — | Octane (70) | B | A | A | A | A |
| 13 | t-BuOLi (30) | — | Octane (70) | B | B | A | A | A |
| 14 | t-BuOLi (30) | — | Ethyl acetate (70) | B | A | A | A | A |
| 15 | t-BuOLi (30) | — | Ethyl alcohol (60) | C | C | B | A | A |
| 16 | t-BuOLi (30) | TEOS(30) | Octane (40) | B | A | A | A | A |
| 17 | t-BuOLi (10) | TEOS(30) | Octane (60) | A | A | A | A | A |
| 18 | t-BuOLi (50) | TEOS(30) | Octane (20) | C | B | A | A | A |

TABLE 1-continued

| | Material and content (wt %) for forming insulation film | | | Homogeneity after a lapse of time (hr) | | | | |
|---|---|---|---|---|---|---|---|---|
| Ex. | Li Source | Si Source | Solvent | 0.5 | 2 | 10 | 24 | 100 |
| 19 | t-BuOLi (30) | TEOS(10) | Octane (60) | A | A | A | A | A |
| 20 | t-BuOLi (30) | TEOS(50) | Octane (20) | C | C | B | A | A |
| 21 | MeOLi (30) | TEOS(30) | Octane (40) | C | C | C | B | A |
| 22 | EtOLi (30) | TEOS(30) | Octane (40) | C | C | C | B | A |
| 23 | n-PrOLi (30) | TEOS(30) | Octane (40) | C | C | C | B | A |
| 24 | i-PrOLi (30) | TEOS(30) | Octane (40) | C | C | B | A | A |
| 25 | n-BuOLi (30) | TEOS(30) | Octane (40) | C | C | C | B | A |
| 26 | i-BuOLi (30) | TEOS(30) | Octane (40) | C | C | C | B | A |
| 27 | s-BuOLi (30) | TEOS(30) | Octane (40) | C | B | A | A | A |
| 28 | t-BuOLi (30) | TMOS(30) | Octane (40) | B | A | A | A | A |
| 29 | t-BuOLi (30) | TEOS(30) | Acetone (40) | B | A | A | A | A |
| 30 | t-BuOLi (30) | TEOS(30) | Ethyl acetate (40) | B | A | A | A | A |
| 31 | t-BuOLi (30) | TEOS(30) | Ethyl alcohol (40) | C | C | A | A | A |

As is apparent from homogeneity after a lapse of time (hr) in Table 1, Examples 1 to 15 in the first aspect of the present invention evidently show that they were practical after a lapse of ten hours or more, although the prepared material was partially not homogeneous. Moreover, Examples 16 to 31 in the second aspect of the present invention evidently shows that they were practical after a lapse of 24 hours or more, although the prepared material was partially not homogeneous.

Example 32

(Fabrication of a Vaporizer)

There was prepared a CVD material feed portion 21 in which the inside thereof was constituted of a fluorocarbon polymers (PFA: a polymer of tetrafluoroethylene and perfluorovinylether), and the portion in contact with the outside of the vaporizer was constituted of stainless steel (SUS316). The PFA made portion 24 was a column having an outside diameter of 16 mm and a height of 34.2 mm. The stainless steel outside the column had a thickness of 2.0 mm. Further, an ejection tube 25 with double structure at front end having an internal tube corresponding to a passageway for the material, and an outer tube corresponding to a passageway for a carrier gas was provided separately in two sets. Additionally, a cooling pipe 26 that provides cooling water around the outside surface of the material feed portion was equipped as a cooling means for the CVD material feed portion.

There was also prepared, in addition to the foregoing material feed portion 21, as illustrated in FIG. 6, a vaporizer 9 which was made of stainless steel (SUS316) and incorporated with a vaporized gas exhaust port 22 and a heater 23. Although not illustrated in FIG. 6, the vaporizer 9 had two ejection tubes 25. The vaporization chamber 20 was in the form of a column having an internal diameter of 65 mm, a height of 92.5 mm and a protrusion with the height of 27.5 mm from the bottom. The vaporized gas exhaust port 22 was placed at a height of 15 mm from the bottom of the vaporizer.

(Fabrication of an Apparatus for Vaporizing and Supplying)

An apparatus for vaporizing and supplying as shown in FIG. 4 was fabricated by connecting a degasser 4, a liquid mass flow controller 5, a carrier gas supply pipeline 12, an oxygen supply pipeline 18, a gas pre-heater 17, a gas flow controller 11, a CVD equipment 10 and so on to the vaporizer 9 and by surrounding with a heat insulator 6.

Further, the oxygen supply pipeline 18 was settled so as to add oxygen just before the vaporizer. Then, the material container filled with the material for forming the insulation film in Example 1 and the material container filled with tetraethoxysilane were connected to the vaporizer via both the degasser 4 and the liquid mass flow controller 5 respectively.

(Formation of Lithium Silicate Film)

An insulation film essentially consisting of lithium silicate was formed over a circular iron-nickel alloy substrate with a diameter of 50 mm by means of the foregoing apparatus for vaporizing and supplying and in accordance with CVD method employing the material for forming the insulation film in Example 1 as follows:

After feeding nitrogen gas into the apparatus for vaporizing and supplying, and into the CVD equipment, the inside of the vaporizer was adjusted to the temperature of 160° C. and at the condition of ordinary pressure, and at the same time, the inside of the CVD equipment was adjusted to the temperature of 680° C. and at the condition of ordinary pressure. Then, the material for forming the insulation film in Example 1 and tetraethoxysilane were fed to the vaporizer at 0.75 g/minute and 1.15 g/minute respectively through the liquid mass flow controller 5, together with feeding nitrogen heated at 150° C. through the carrier gas supply pipeline to the vaporizer with the flow rate of 5,000 milliliter/minute, and the material vaporized was supplied to the CVD equipment. At the same time, oxygen heated at 160° C. was added with the flow rate of 2,000 milliliter/minute just before the CVD equipment.

(Evaluation of Lithium Silicate Film)

As a result of analysis by means of atomic force microscope with regard to the resultant insulation film, the film thickness was 0.30 μm, and it was recognized that the insulation film of high purity and uniform essentially consisting of lithium silicate was obtained.

Example 33

(Fabrication of an Apparatus for Vaporizing and Supplying)

The apparatus for vaporizing and supplying as shown in FIG. 3 was fabricated in a similar way as Example 32 except that the material container filled with the material for forming the insulation film in Example 16 instead of the material in Example 1 was connected.

(Formation of Lithium Silicate Film)

An insulation film essentially consisting of lithium silicate was formed over a circular iron-nickel alloy substrate with a diameter of 50 mm by means of the foregoing apparatus for vaporizing and supplying and in accordance with CVD method employing the material for forming the insulation film in Example 16 as follows:

After feeding nitrogen gas into the apparatus for vaporizing and supplying, and into the CVD equipment, the inside of the vaporizer was adjusted to the temperature of 160° C. and at the condition of ordinary pressure, and at the same time, the inside of the CVD equipment was adjusted to the temperature of 680° C. and at the condition of ordinary pressure. Then, the material for forming the insulation film in Example 16 was fed to the vaporizer at 1.9 g/minute through the liquid mass flow controller, together with feeding nitrogen heated at 150° C. through the carrier gas supply pipeline to the vaporizer with the flow rate of 5,000 milliliter/minute, and the material vaporized was supplied to the CVD equipment. At the same time, oxygen heated at 160° C. was added with the flow rate of 2,000 milliliter/minute just before the CVD equipment.

(Evaluation of Lithium Silicate Film)

As a result of analysis by means of atomic force microscope with regard to the resultant an insulation film, the film thickness was 0.28 μm, and it was recognized that the insulation film of high purity and uniform essentially consisting of lithium silicate was obtained.

Example 34

(Preparation of the Material for Forming an Insulation Film)

Nitrogen gas was fed through the inert gas supply pipeline to a container made of stainless steel (SUS 316) and with the internal diameter of 8 cm and the height of 10 cm, and the interior of the container became ambient atmosphere of nitrogen. Subsequently, 10 g of lithium acetate as the carboxylate of lithium was cast into the material container, and the lithium acetate was dissolved by adding 86 g of methyl alcohol together with 4 g of acetone as the organic solvent. Further, 100 g of tetra ethoxysilane (TEOS) was added and the mixed solution was stirred at the temperature of 25° C. and at the condition of ordinary pressure. (lithium acetate: 5% by weight, tetra ethoxysililane (TEOS): 50% by weight, organic solvent: 45% by weight)

(Evaluation About the Homogeneity of the Material for Forming an Insulation Film)

While maintaining the ripening condition at the temperature of 25° C. and at ordinary pressure, the material for forming an insulation film was sampled at 30 minutes, 2 hours, 10 hours, 24 hours, and 100 hours respectively after mixing, and was evaluated whether the material was mixed homogeneously or not. The results are shown in Table 2.

Examples 35 to 38

Examples 35 to 38 were conducted similarly as Example 34 except that the amount of the content of each component were changed as shown in Table 2 respectively. As the results, materials for forming the insulation film were prepared. Evaluation about the homogeneity of the material for forming the insulation film was carried out in the same way as Example 34 and the results are shown Table 2.

Examples 39 to 41

Examples 39 to 41 were conducted similarly as Example 34 except that acetone was replaced by tetrahydrofuran (THF), butyl acetate, or octane respectively. As the results, materials for forming the insulation film were prepared. Evaluation about the homogeneity of the material for forming the insulation film was carried out in the same way as Example 34 and the results are shown Table 2.

Example 42

Example 42 was conducted similarly as Example 34 except that methyl alcohol was replace by ethyl alcohol and a material for forming an insulation film was prepared. Evaluation about the homogeneity of the material for forming the insulation film was carried out in the same way as Example 34 and the results are shown Table 2.

TABLE 2

| | Material and content (wt %) for forming insulation film | | | Homogeneity after a lapse of ripening time (hr) | | | | |
|---|---|---|---|---|---|---|---|---|
| Ex. | Li Source | Si Source | Solvent | 0.5 | 2 | 10 | 24 | 100 |
| 34 | Lithium acetate (5) | TEOS(50) | Methanol (43), Acetone (2) | B | A | A | A | A |
| 35 | Lithium acetate (4) | TEOS(51) | Methanol (43), Acetone (2) | B | A | A | A | A |
| 36 | Lithium acetate (6) | TEOS(49) | Methanol (43), Acetone (2) | B | B | A | A | A |
| 37 | Lithium acetate (4) | TEOS(40) | Methanol (54), Acetone (2) | B | A | A | A | A |
| 38 | Lithium acetate (6) | TEOS(60) | Methanol (32), Acetone (2) | B | B | A | A | A |
| 39 | Lithium acetate (5) | TEOS(50) | Methanol (43), THF (2) | C | B | B | A | A |
| 40 | Lithium acetate (5) | TEOS(50) | Methanol (43), Butyl acetate (2) | C | B | A | A | A |
| 41 | Lithium acetate (5) | TEOS(50) | Methanol (43), Octane (2) | C | C | B | A | A |
| 42 | Lithium acetate (5) | TEOS(50) | Ethanol (43), Acetone (2) | C | B | A | A | A |

As is apparent from homogeneity after a lapse of time (hr) in Table 2, Example 34 to 42 in the third aspect the present invention evidently show that they were practical after a lapse of ten hours or more, although the prepared material was partially not homogeneous.

Example 43

An insulation film essentially consisting of lithium silicate was formed over a circular iron-nickel alloy substrate with a diameter of 50 mm by means of the apparatus as shown in FIG. 1 in accordance with spin coating method employing the material (ripening time: 2 hours) for forming the insulation film in Example 34.

In the occasion of the insulation film-forming, inside of the spin coating machine was maintained at room temperature (25° C.) and at ordinary pressure, together with rotating the substrate with 5,000 rpm, and the material for forming the insulation film was dripped at the central portion of the substrate with the flow rate of 2 g/minute thereby being spread over the substrate. Then, the coated substrate was taken out and heat-treated at the temperature of 680° C. for 30 minutes.

As a result of analysis by means of atomic force microscope with regard to the resultant insulation film, the film thickness was 0.3 μm, and it was recognized that the insulation film of high purity and uniform essentially consisting of lithium silicate was obtained.

Example 44

An insulation film essentially consisting of lithium silicate was formed over a circular iron-nickel alloy substrate with a diameter of 50 mm by means of the apparatus as shown in FIG. 2 in accordance with mist deposition method employing the material (ripening time: 2 hours) for forming the insulation film in Example 34. In the occasion of the insulation film-forming, inside of the mist deposition equipment was maintained at room temperature (25° C.) and at ordinary pressure, and the material for forming the insulation film was fed to the shower head with the flow rate of 2 g/minute thereby being deposited over the substrate. Then, the coated substrate was taken out and heat-treated at the temperature of 680° C. for 30 minutes.

As a result of analysis by means of atomic force microscope with regard to the resultant insulation film, the film thickness was 0.5 μm, and it was recognized that the insulation film of high purity and uniform essentially consisting of lithium silicate was obtained.

Example 45

An insulation film essentially consisting of lithium silicate was formed over a circular iron-nickel alloy substrate with a diameter of 50 mm by means of the apparatus as shown in FIG. 3 in accordance with CVD method employing the material (ripening time: 2 hours) for forming the insulation film in Example 34 as the description below. Further, the vaporizer in which the inside thereof was constituted of a fluorocarbon polymers (PFA), and the portion in contact with the outside of the vaporizer was constituted of stainless steel (SUS316) was employed, while an ejection tube to the vaporizing chamber had a double structure having an internal tube for ejecting the material, and an outer tube for ejecting the carrier gas was employed.

After feeding nitrogen gas into the apparatus for vaporizing and supplying, and into the CVD equipment, the inside of the CVD equipment was adjusted to the temperature of 680° C. and at the condition of ordinary pressure, and at the same time, the inside of the vaporizer was adjusted to the temperature of 190° C. and at the condition of an ordinary pressure. Then, the material for forming the insulation film was fed to the vaporizer at 2 g/minute through liquid mass flow controller, together with feeding nitrogen heated at 210° C. through the carrier gas supply pipeline to the vaporizer with the flow rate of 5,000 milliliter/minute, and the material vaporized was supplied to the CVD equipment.

As a result of analysis by means of atomic force microscope with regard to the resultant insulation film, the film thickness was 0.5 μm, and it was recognized that the insulation film of high purity and uniform essentially consisting of lithium silicate was obtained.

Comparative Example 1

Comparative Example 1 was conducted similarly as Example 1 except that tert-butoxylithium (t-BuOLi) was replaced by lithium oxide ($Li_2O$) and a material for forming an insulation film was prepared. Evaluation about the homogeneity of the material for forming the insulation film was carried out in the same way as Example 1 and the results are shown Table 3.

Comparative Example 2

Comparative Example 2 was conducted similarly as Example 16 except that tert-butoxylithium (t-BuOLi) was replaced by lithium oxide ($Li_2O$) and a material for forming an insulation film was prepared. Evaluation about the homogeneity of the material for forming the insulation film was carried out in the same way as Example 1 and the results are shown Table 3.

TABLE 3

| Com. Ex. | Material and content (wt %) for forming insulation film | | | Homogeneity after a lapse of time (hr) | | | | |
|---|---|---|---|---|---|---|---|---|
| | Li Source | Si Source | Solvent | 0.5 | 2 | 10 | 24 | 100 |
| 1 | $Li_2O$(30) | — | Octane (70) | C | C | C | C | C |
| 2 | $Li_2O$(30) | TEOS(30) | Octane (40) | C | C | C | C | C |

As is apparent from homogeneity after a lapse of time (hr) in Table 3, Comparative Examples 1 and 2 evidently show that they were not practical because the prepared material was not homogeneous even after a lapse of 100 hours or more.

INDUSTRIAL APPLICABILITY

In accordance with the present invention, a material for forming an insulation film containing lithium, or lithium silicate that were conventionally difficult to be made homogeneous becomes possible to be made homogeneous. As a result, insulation film-forming by spin coating method, mist deposition method or CVD method with the use of these material becomes possible and enables to expect providing an insulation film of high quality and high purity.

What is claimed is:

1. A film-forming method for forming an insulation film containing lithium silicate over the surface of a substrate by a CVD method, with the use of materials for forming the insulation film comprising a lithium source selected from a group consisting of alkoxide compounds of lithium, formic acid lithium and propionic acid lithium; and at least one kind of organic solvent selected from a group consisting of ether, ketone, ester, alcohol, and hydrocarbon; and further comprising a silicon source selected from a group consisting of tetramethoxysilane and tetraethoxysilane; wherein the CVD method comprises a step of mixing the materials after vaporizing each material separately or a step of vaporizing after mixing the materials.

2. The film-forming method according to claim 1, wherein the materials further comprise a surfactant.

3. The film-forming method according to claim 1, wherein said alkoxide compounds of lithium are selected from the group consisting of methoxylithium, ethoxylithium, n-propoxylithium, iso-propoxylithium, n-butoxylithium, iso-butoxylithium, sec-butoxylithium, and tert-butoxylithium.

4. The film-forming method according to claim 1, wherein in said mixing the materials, initially said lithium source and said at least one kind of organic solvent are mixed, to form a mixture, and thereafter said silicon source is mixed with said mixture.

5. The film-forming method according to claim 1, wherein said substrate is silicon substrate, ceramics substrate, glass substrate, metal substrate, or alloy substrate.

6. The film-forming method according to claim 1, wherein heat-treating temperature in an occasion of insulation film-forming is 150 to 800° C.

7. The film-forming method according to claim 1, wherein at least one kind selected from oxygen, ozone and steam is added in an occasion of insulation film-forming.

* * * * *